US008653576B2

United States Patent
Lee et al.

(10) Patent No.: US 8,653,576 B2
(45) Date of Patent: Feb. 18, 2014

(54) METHOD OF FABRICATING A SONOS GATE STRUCTURE WITH DUAL-THICKNESS OXIDE

(75) Inventors: Tzyh-Cheang Lee, Hsinchu (TW); Jiunn-Ren Hwang, Hsin-Chu (TW); Tsung-Lin Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 681 days.

(21) Appl. No.: 12/648,598

(22) Filed: Dec. 29, 2009

(65) Prior Publication Data
US 2010/0136779 A1 Jun. 3, 2010

Related U.S. Application Data

(62) Division of application No. 11/243,165, filed on Oct. 4, 2005, now abandoned.

(51) Int. Cl.
*H01L 29/76* (2006.01)
(52) U.S. Cl.
USPC .......................................................... 257/314

(58) Field of Classification Search
USPC .................................. 438/595, 288, 257, 315
See application file for complete search history.

(56) References Cited

U.S. PATENT DOCUMENTS 7,151,293 B1 12/2006 Shiraiwa et al.
2004/0232477 A1* 11/2004 Iwata et al. ................... 257/315

* cited by examiner

*Primary Examiner* — Matthew Reames
*Assistant Examiner* — Nicholas J Choi
(74) *Attorney, Agent, or Firm* — McClure, Qualey & Rodack, LLP (57) ABSTRACT

A method of forming a SONOS gate structure. The method includes forming a gate pattern with sidewalls on a substrate, wherein the gate pattern includes a gate dielectric layer patterned on the substrate and a gate electrode patterned on the gate dielectric layer, forming a first oxide layer on the gate pattern and the substrate; etching back the first oxide layer to expose the substrate and the top of the gate electrode, leaving oxide spacers along the sidewalls of the gate pattern respectively; forming a second oxide layer on the substrate and the oxide spacers; and forming trapping dielectric spacers on the second oxide layer adjacent to the sidewalls of the gate pattern respectively.

8 Claims, 7 Drawing Sheets

METHOD OF FABRICATING A SONOS GATE STRUCTURE WITH DUAL-THICKNESS OXIDE

RELATED APPLICATIONS

This application is a divisional of U.S. application Ser. No. 11/243,165, filed on Oct. 4, 2005, hereby incorporated by reference as it fully set forth herein.

TECHNICAL FIELD

The present invention relates to nonvolatile memory devices, and particularly to a sidewall SONOS (silicon-oxide-nitride-oxide-silicon) gate structure with dual-thickness oxide and methods of fabricating a nonvolatile memory device having the same.

BACKGROUND

Nonvolatile memories (NVM) are classified into a stacked gate structure and a SONOS (silicon-oxide-nitride-oxide-silicon) gate structure depending on the type of its gate structure. The SONOS gate structure has gained increased interest due to the simplicity of the bitcell structure and process, low-voltage operation and its immunity to extrinsic charge loss as compared to traditional floating gate based nonvolatile memories. The SONOS gate structure nonvolatility is achieved by storing charge in nitride traps and surrounding the nitride with oxide to form an oxide-nitride-oxide stack on the sidewall of a gate electrode, also named a sidewall SONOS gate structure, which does not include a floating gate and is compatible with standard logic CMOS fabrication processes.

The sidewall SONOS gate structure typically utilizes thin and uniform tunnel oxide for both electron program and hole erase operations resulting in programming time slower than desired for many high-density embedded flash applications. Since the tunnel oxide is formed after the gate formation, the use of a thin bottom oxide grown on the silicon substrate for providing a thin tunnel oxide, however, also provides a thin sidewall oxide grown on the gate sidewall, which causes severe read disturb in the selected bitcell and gate disturb in the unselected bitcells sharing the same word line during a read operation. One approach to minimize gate disturb for the sidewall SONOS gate structure would be to increase the thickness of the tunnel oxide, but the use of the much thicker tunnel oxide will lower program/erase (P/E) speed. It is therefore desirable to provide a novel SONOS gate structure for inhibiting gate disturb and keeping high program/erase efficiency simultaneously.

SUMMARY OF THE INVENTION

Embodiments of the present invention include a sidewall SONOS gate structure with dual-thickness oxide for reducing impacts of tunnel thickness on gate disturb and program/erase speed and methods of fabricating the same.

In one aspect, the present invention provides a SONOS gate structure comprising: a gate pattern with sidewalls on a substrate, wherein the gate pattern comprises a gate dielectric layer and a gate electrode; an oxide structure on the substrate and the sidewalls of the gate pattern, wherein the oxide structure comprises a relatively thinner oxide portion on the substrate and a relatively thicker oxide portion on one of the sidewalls of the gate pattern; and trapping dielectric spacers on the oxide structure laterally adjacent to the sidewalls of the gate pattern respectively.

In another aspect, the present invention provides a method of forming a SONOS gate structure, comprising: forming a gate pattern with sidewalls on a substrate, wherein the gate pattern comprises a gate dielectric layer patterned on the substrate and a gate electrode patterned on the gate dielectric layer; forming a first oxide layer on the gate pattern and the substrate; etching back the first oxide layer to expose the substrate and the top of the gate electrode, leaving oxide spacers along the sidewalls of the gate pattern respectively; forming a second oxide layer on the substrate and the oxide spacers, wherein the second oxide layer on the substrate is a relatively thinner oxide portion, and a combination of the oxide spacer and the second oxide layer along one of the sidewalls of the gate pattern is a relatively thicker oxide portion; and forming trapping dielectric spacers on the second oxide layer adjacent to the sidewalls of the gate pattern respectively.

In another aspect, the present invention provides a method of forming a SONOS gate structure, comprising: forming a gate pattern with sidewalls on a substrate, wherein the gate pattern comprises a gate dielectric layer patterned on the substrate and a gate electrode patterned on the gate dielectric layer; forming a first oxide layer on the gate pattern and the substrate; forming a first dielectric layer on the first oxide layer; etching back the first dielectric layer to expose the first oxide layer, leaving first dielectric spacers on the first oxide layer adjacent to the sidewalls of the gate pattern respectively; etching back the first oxide layer and the first dielectric spacers to expose the substrate and the top of the gate electrode, leaving oxide spacers along the sidewalls of the gate pattern respectively, and leaving the first dielectric spacers on the oxide spacers respectively; forming a second oxide layer on the exposed portions of the substrate, the gate electrode and the oxide spacers; forming a second dielectric layer on the first dielectric spacers and the second oxide layer; and etching back the second dielectric layer to expose the second oxide layer, leaving second dielectric spacers adjacent to the sidewalls of the gate pattern respectively.

BRIEF DESCRIPTION OF THE DRAWINGS

The aforementioned objects, features and advantages of this invention will become apparent by referring to the following detailed description of the preferred embodiments with reference to the accompanying drawings, wherein.

DETAILED DESCRIPTION OF ILLUSTRATIVE EMBODIMENTS

Preferred embodiments of the present invention provide a sidewall SONOS gate structure with dual-thickness oxide for reducing impacts of tunnel thickness on gate disturb and program/erase speed and methods of fabricating the same.

Particularly, the dual-thickness oxide comprises a relatively thinner oxide portion overlying a substrate, serving as a thin tunnel oxide layer for keeping good program/erase efficiency, and a relatively thicker oxide portion overlying sidewalls of a gate electrode for reducing gate disturb. The dual-thickness oxide therefore can inhibit gate disturb and keep high program/erase speed simultaneously. The dual-thickness oxide is intended to include silicon oxide or any other oxide-based dielectric materials. Although the embodiments of the present invention illustrate an oxide layer for forming a tunnel layer of the SONOS gate structure, the present invention also provides value when using any other dielectric materials for forming the tunnel layer.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Figure 1:
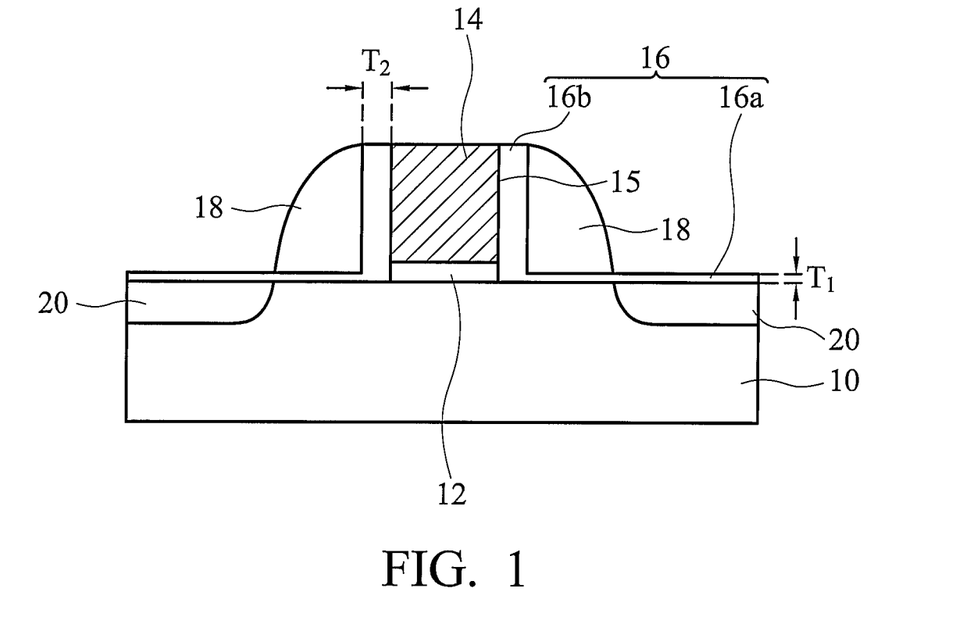
FIG. 1 is a cross-sectional diagram illustrating an exemplary embodiment of a sidewall SONOS gate structure with dual-thickness oxide.

Herein, a cross-sectional diagram of FIG. 1 illustrates an exemplary embodiment of a sidewall SONOS gate structure with dual-thickness oxide. An example of a sidewall SONOS gate structure comprises a gate pattern with sidewalls 15 on a substrate 10. The gate pattern includes a gate dielectric layer 12 patterned on a substrate 10, and a gate electrode 14 patterned on the gate dielectric layer 12. A dual-thickness oxide structure 16 is provided to line the substrate 10 and the sidewalls 15 of the gate pattern. Trapping dielectric spacers 18 is patterned on the dual-thickness oxide structure 16 laterally adjacent to the sidewalls 15 respectively. Source/drain regions 20 are formed in the substrate 10 separated apart from each other laterally adjacent to the trapping dielectric spacers 18.

The substrate 10 may comprise an elementary semiconductor such as silicon, germanium, or a compound semiconductor. The substrate 10 may include an epitaxial layer overlying a bulk semiconductor, a silicon germanium layer overlying a bulk silicon, a silicon layer overlying a bulk silicon germanium, or a semiconductor-on-insulator (SOI) structure. The substrate 10 may comprise an isolation feature to separate different devices formed thereon. The gate dielectric layer 12 may comprise a silicon oxide layer, which may be formed through a thermal oxidation process or a chemical vapor deposition (CVD) process. The gate dielectric layer 12 may also be other well-known dielectric materials such as nitrides, oxynitride, high-k materials, any other non-conductive materials, and combinations thereof. The thickness of the gate dielectric layer 12 is chosen specifically for the scaling requirements of the sidewall SONOS memory device technology. The gate electrode 14 may comprise a polysilicon layer formed through, for example Low Pressure CVD (LPCVD) methods, CVD methods and Physical Vapor Deposition (PVD) sputtering methods employing suitable silicon source materials. If desired the polysilicon layer may be ion implanted to the desired conductive type. It is to be appreciated that other well-known gate electrode material such as metal, metal alloys, single crystalline silicon, or any combinations thereof may be used.

The dual-thickness oxide structure 16 includes a thinner oxide portion 16a on the substrate 10 and a thicker oxide portion 16b on the sidewalls 15. The thinner oxide portion 16a, serving as a thin tunnel oxide layer, may reach to a thickness $T_1$ less than or equal to about 60 Angstroms (for example, about 20~60 Angstroms), which can keep good program/erase efficiency. The thicker oxide portion 16b may reach to a thickness $T_2$ greater than or equal to about 70 Angstroms (for example, about 70~200 Angstroms), which can inhibit gate disturb. The dual-thickness oxide structure 16 is preferably made of silicon oxide through the use of a thermal oxidation process or a chemical vapor deposition (CVD) process. Other suitable dielectric materials may be used in place of silicon oxide, for example high-k dielectric materials, metal oxide materials or any other oxide-based materials.

The trapping dielectric spacers 18 are formed through advances in deposition, lithography and masking techniques and dry etch processes. The trapping dielectric spacer 18 is preferably a silicon nitride layer. Other suitable dielectric materials may be used in place of silicon nitride, for example silicon oxynitride, boron nitride, or high-k dielectric materials with a high amount of trap-sites.

Figure 2A:
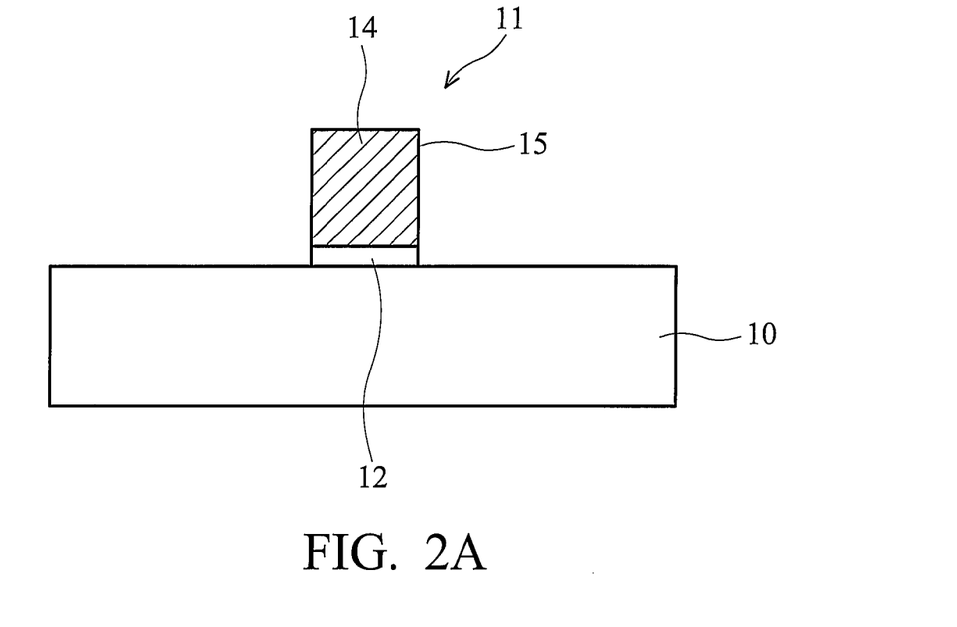
FIGS. 2A to 2F are cross-sectional diagrams illustrating a method of forming the dual-thickness oxide scheme for the sidewall SONOS gate structure in accordance with one embodiment of the present invention.

Cross-sectional diagrams of FIGS. 2A to 2F illustrate a method of forming the dual-thickness oxide scheme for the sidewall SONOS gate structure in accordance with one embodiment of the present invention. Explanation of the same or similar portions to the description in FIG. 1 is omitted herein. In FIG. 2A, a dielectric material, a gate material and a hard mask material are successively deposited on an active area of the substrate 10, and then those stacked layers are patterned to form a gate pattern 11 with the sidewalls 15. The gate pattern 11 includes the gate dielectric layer 12 and the gate electrode 14. The hard mask material is then removed. The patterning step may be accomplished using photolithography and etching to transfer the pattern defined by a photomask to the deposited materials. The photolithography process may include photoresist coating, soft baking, mask aligning, exposing, post-exposure baking, developing photoresist, hard baking, and photoresist stripping. The etching process may include wet etch, dry etch, ion-reactive-etch (RIE), and other suitable processing.

Figure 2B:
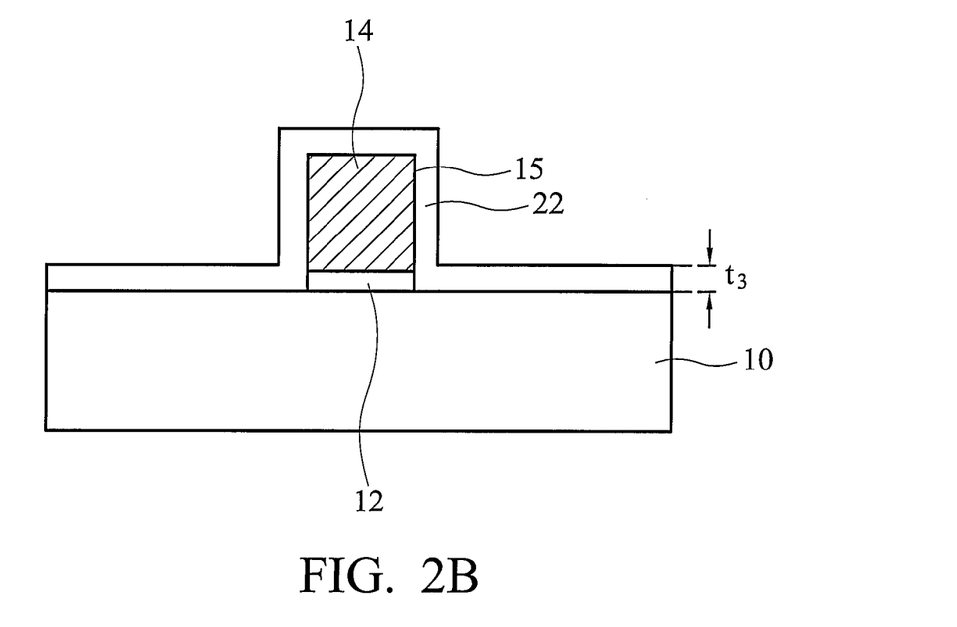

In FIG. 2B, a first oxide layer 22 is formed on the substrate 10, which covers at least the sidewalls 15. For example, the first oxide layer 22 is grown on the exposed portions of the substrate 10 and the gate electrode 14 through a thermal oxidation process to reach a thickness $t_3$ from about 100 Angstroms to about 300 Angstroms. The first oxide layer 22 is preferably made of silicon oxide through the use of a thermal oxidation process or a chemical vapor deposition (CVD) process. Other suitable dielectric materials may be used in place of silicon oxide, for example high-k dielectric materials, metal oxide materials or any other oxide-based materials.

Figure 2C:
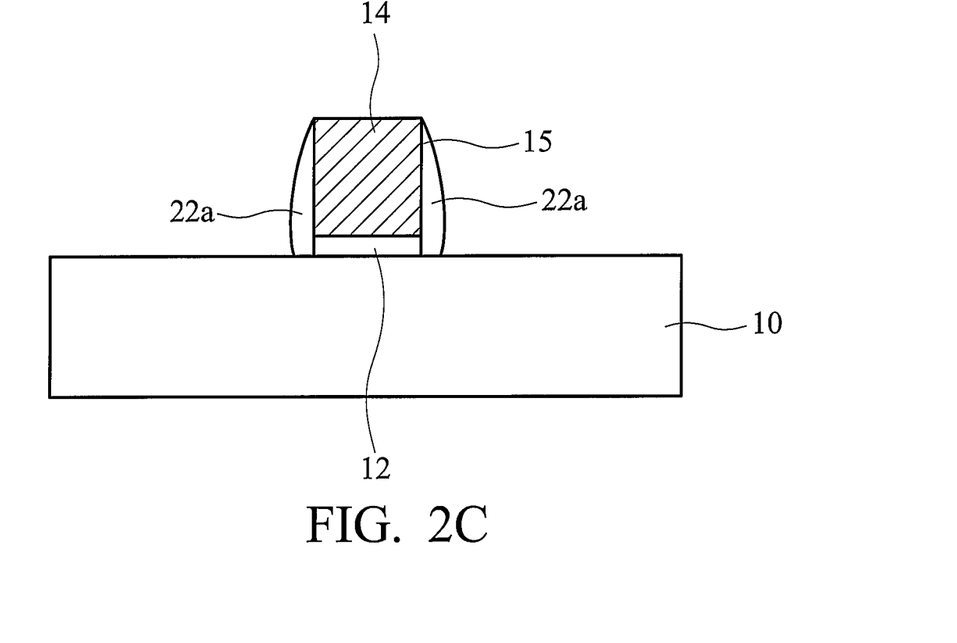

Next, in FIG. 2C, the first oxide layer 22 is etched back to expose the top of the gate electrode 14, leaving oxide spacers 22a on the sidewalls 15 respectively. In detail, certain regions (horizontal portions) of the first oxide layer 22 are etched to expose the substrate 10 and the top of the gate electrode 14, leaving certain regions (vertical portions) of the first oxide layer 22 laterally adjacent to the gate electrode 14 and the gate dielectric layer 12. The etch back process may use an anisotropic etch process, such as dry etch, RIE (Reactive Ion Etching), or other plasma etching processes.

Figure 2D:
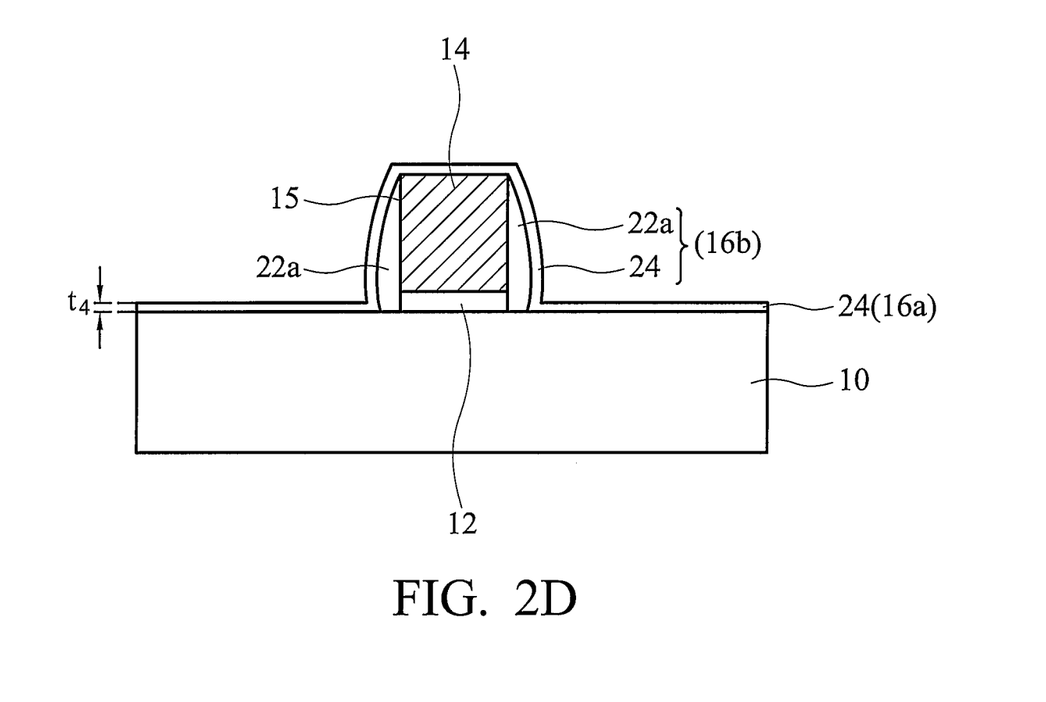

In FIG. 2D, a second oxide layer 24 is formed on the substrate 10 to line the oxide spacers 22a and the top of the gate electrode 14. For example, the second oxide layer 24 is conformally grown on the exposed portions of the substrate 10, the oxide spacers 22a and the gate electrode 14 through an oxidation process to reach a thickness $t_4$ from about 20 Angstroms to about 60 Angstroms. The combination of the oxide spacer 22a and the second oxide layer 24 therefore functions as the dual-thickness oxide structure 16 as described in FIG. 1, wherein the second oxide layer 24 on the substrate 10 is for the thinner oxide portion 16a application, and the oxide spacer 22a combined with the second oxide layer 24 along the sidewall 15 is for the thicker oxide portion 16b application. The second oxide layer 24 is preferably made of silicon oxide through the use of a thermal oxidation process or a chemical vapor deposition (CVD) process. Other suitable dielectric materials may be used in place of silicon oxide, for example high-k dielectric materials, metal oxide materials or any other oxide-based materials. The second oxide layer 24 is intended to use an oxide material the same as the first oxide layer 22. The present invention also provides value when the second oxide layer 24 uses an oxide material different from that used in the first oxide layer 22. The present invention also provides value when the second oxide layer 24 uses an oxide material different from that used in the first oxide layer 22.

Figure 2E:
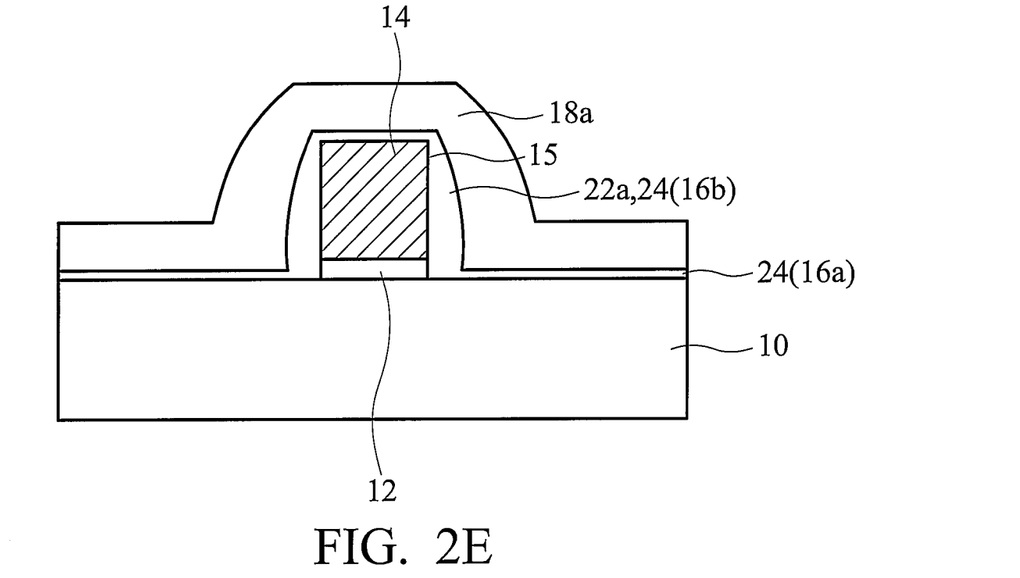
Figure 2F:
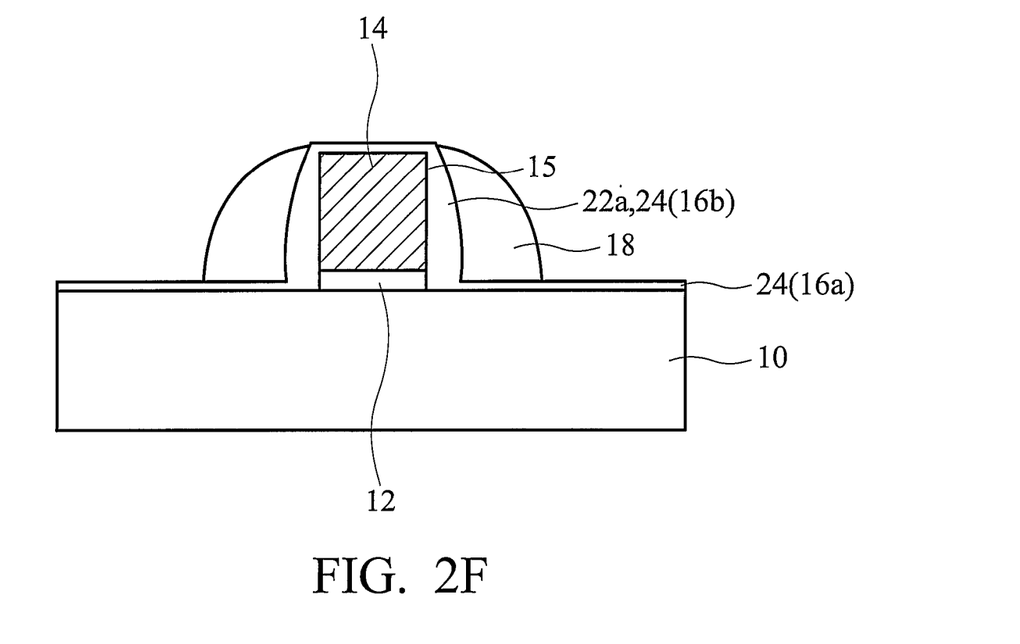

Next, in FIG. 2E, a trapping dielectric material 18a is deposited on the substrate 10 to cover the second oxide layer 24, and then the trapping dielectric material 18a is patterned as the dielectric spacers 18 laterally adjacent to the sidewalls 15 respectively, as depicted in FIG. 2F, through advances in lithography and masking techniques and dry etch processes. The trapping dielectric material 18a is preferably a silicon nitride layer. Other suitable dielectric materials may be used in place of silicon nitride, for example silicon oxynitride, boron nitride, or high-k dielectric materials with a high amount of trap-sites. After completing the dual-thickness oxide structure 16 and the trapping dielectric spacers 18, source/drain regions will be formed in the substrate 10 by implanting ion dopants into the substrate 10 with the trapping dielectric spacers 18 as the implantation mask. The second oxide layer 24 remaining on the top of the gate electrode 14 may be retained or removed, which is not limited in the present invention.

Figure 3A:
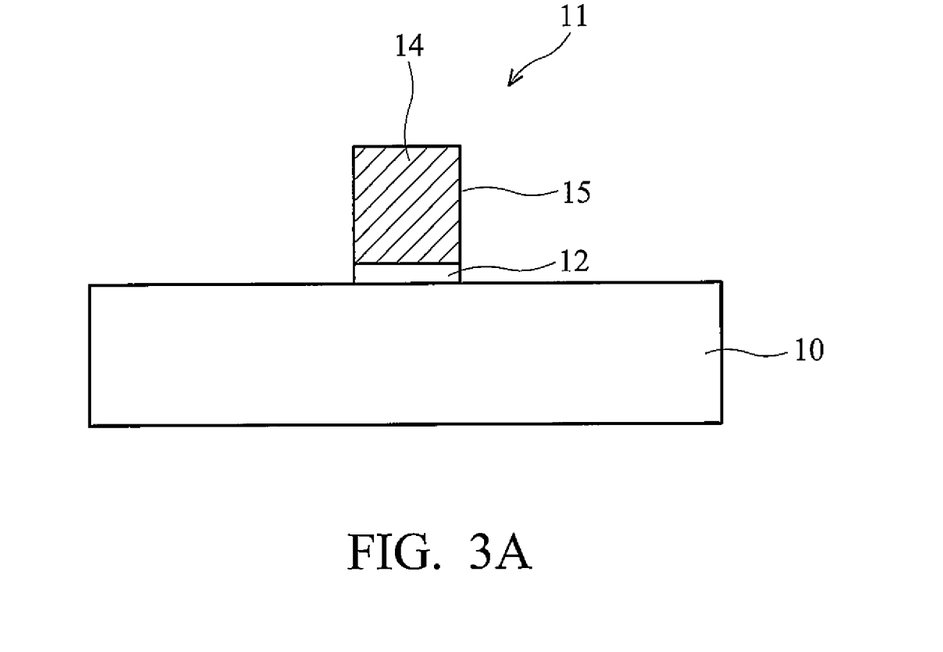
FIGS. 3A to 3F are cross-sectional diagrams illustrating another method of forming the dual-thickness oxide scheme for the sidewall SONOS gate structure in accordance with one embodiment of the present invention.

Cross-sectional diagrams of FIGS. 3A to 3F illustrate another method of forming the dual-thickness oxide scheme for the sidewall SONOS gate structure in accordance with one embodiment of the present invention. Explanation of the same or similar portions to the description in FIG. 1 is omitted herein. In FIG. 3A, a dielectric material, a gate material and a hard mask material are successively deposited on an active area of the substrate 10, and then those stacked layers are patterned to form the gate pattern 11 with the sidewalls 15. The gate pattern 11 includes the gate dielectric layer 12 and the gate electrode 14 which are sequentially stacked. The hard mask material is then removed. The patterning step including the photolithography process and the etching process is similar to that described in FIG. 2A, thus omitted herein.

Figure 3B:
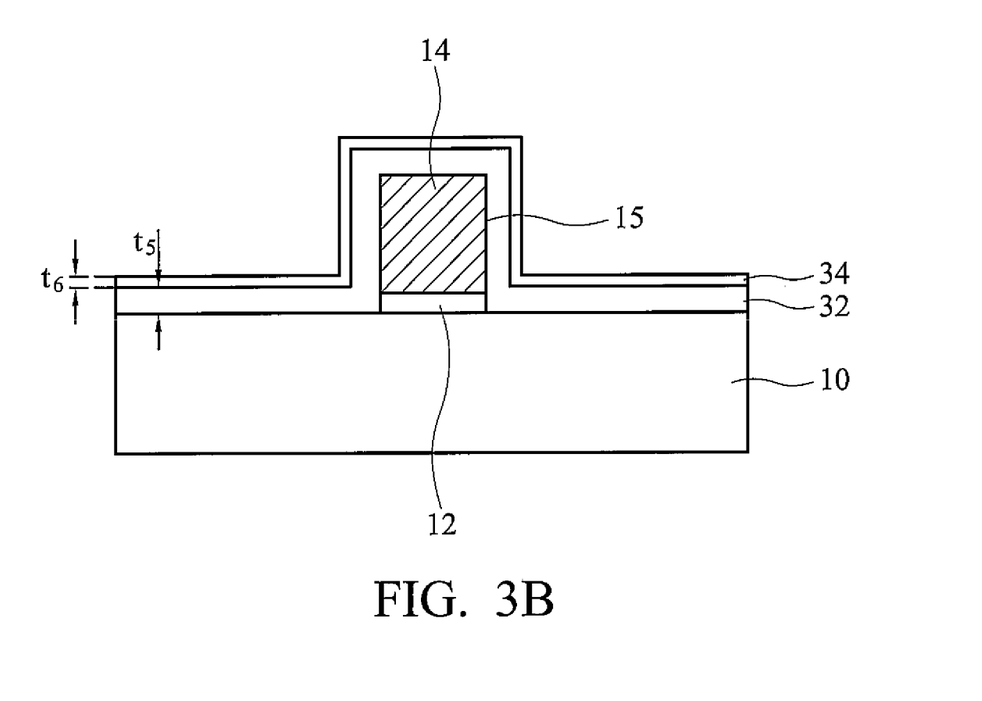

In FIG. 3B, a first oxide layer 32 and a first dielectric layer 34 are successively formed on the substrate 10. For example, the first oxide layer 32 is grown on the exposed portions of the substrate 10 and the gate electrode 14 through a thermal oxidation process to reach a thickness $t_5$ from about 70 Angstroms to about 200 Angstroms. The first oxide layer 32 is preferably made of silicon oxide through the use of a thermal oxidation process or a chemical vapor deposition (CVD) process. Other suitable dielectric materials may be used in place of silicon oxide, for example high-k dielectric materials, metal oxide materials or any other oxide-based materials. The first dielectric layer 34 is conformally deposited on the first oxide layer 32 through the use of CVD. Preferably, the first dielectric layer 34 is a silicon nitride layer with a thickness $t_6$ of about 80~120 Angstroms. Other suitable dielectric materials may be used in place of silicon nitride, for example silicon oxynitride, boron nitride, or high-k dielectric materials with a high amount of trap-sites.

Figure 3C:
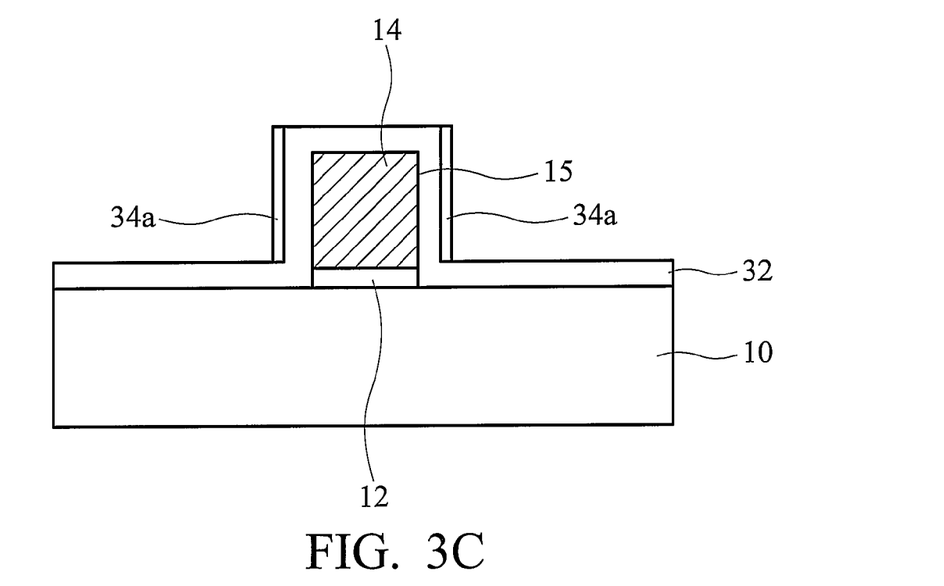

Next, in FIG. 3C, the first dielectric layer 34 is etched back to expose horizontal regions of the first oxide layer 32, leaving dielectric spacers 34a on the vertical regions of the first oxide layer 32 laterally adjacent to the sidewalls 15 respectively. The etch back process may use an anisotropic etch process, such as dry etch, RIE (Reactive Ion Etching), or other plasma etching processes.

Figure 3D:
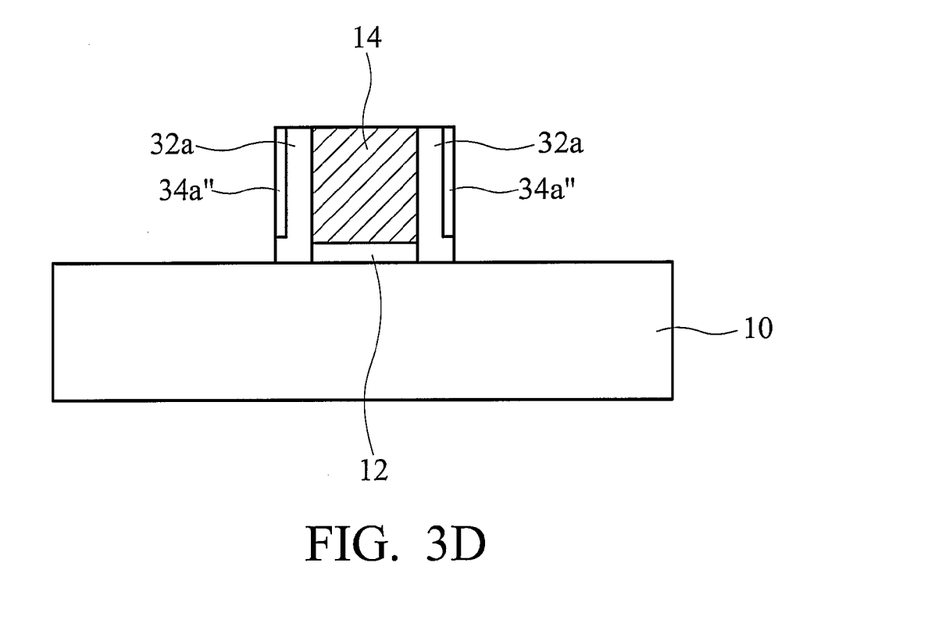

Next, in FIG. 3D, the first oxide layer 32 is etched back to expose the substrate 10 and the top of the gate electrode 14, leaving oxide spacers 32a on the sidewalls 15 respectively. In detail, horizontal portions of the first oxide layer 32 are etched to expose the substrate 10 and the top of the gate electrode 14, leaving vertical portions of the first oxide layer 32 laterally adjacent to the gate electrode 14 and the gate dielectric layer 12. Also, portions of the dielectric spacers 34 are etched to be leveled off with the oxide spacers 32a, leaving the dielectric spacers 34a" on the oxide spacers 32a respectively. The etch back process may use an anisotropic etch process, such as dry etch, RIE (Reactive Ion Etching), or other plasma etching processes.

Figure 3E:
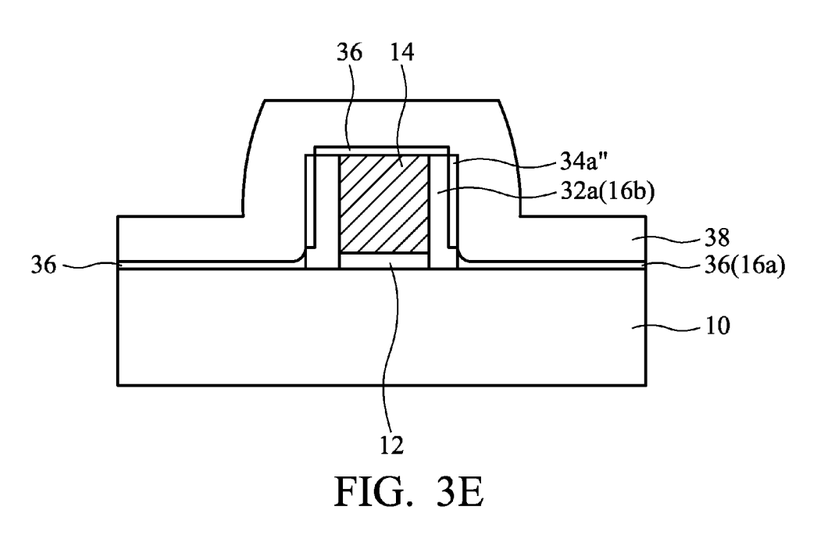
Figure 3F:
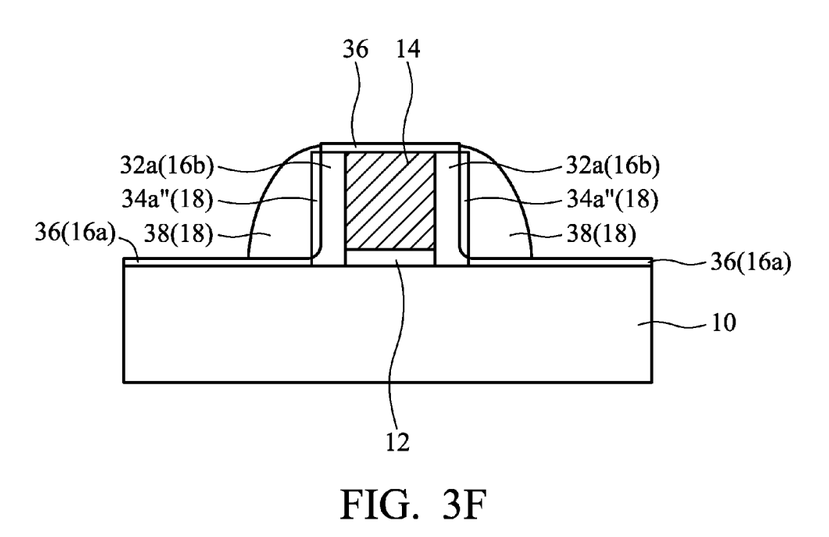

In FIG. 3E, a second oxide layer 36 is selectively formed on the exposed portions of the oxide spacers 32a, the gate electrode 14 and the substrate 10. For example, the second oxide layer 36 is selectively grown on the exposed portions of the substrate 10, the oxide spacers 32a (16b) and the gate electrode 14 through an oxidation process to reach a thickness from about 20 Angstroms to about 60 Angstroms. The second oxide layer 36 is preferably made of silicon oxide through the use of a thermal oxidation process. Other suitable dielectric materials may be used in place of silicon oxide, for example high-k dielectric materials, metal oxide materials or any other oxide-based materials. The second oxide layer 36 is intended to use an oxide material the same as the first oxide layer 32. The present invention also provides value when the second oxide layer 36 uses an oxide material different from that used in the first oxide layer 32. Therefore, the combination of the oxide spacer 32a and the second oxide layer 36 functions as the dual-thickness oxide structure 16 as described in FIG. 1, wherein the second oxide layer 36 with a relatively thinner thickness disposed on the substrate 10 is for the thinner oxide portion 16a application, and the oxide spacer 32a with a relatively thicker thickness disposed along the sidewall 15 is for the thicker oxide portion 16b application.

Still referring to FIG. 3E, a second dielectric layer 38 is deposited on the substrate 10 to cover the second oxide layer 36 and the dielectric spacers 34a". The second dielectric layer 38 is a silicon nitride layer. Other suitable dielectric materials may be used in place of silicon nitride, for example silicon oxynitride, boron nitride, or high-k dielectric materials with a high amount of trap-sites. The second dielectric layer 38 is intended to use a trapping dielectric material the same as the first dielectric layer 34. The present invention also provides value when the second dielectric layer 38 uses a trapping dielectric material different from that used in the first dielectric layer 34. The combination of the second dielectric layer 38 and the dielectric spacers 34a" therefore functions as a trapping dielectric material, which is then patterned as the trapping dielectric spacers 18 laterally adjacent to the sidewalls 15 respectively, as described in FIG. 3F, through advances in lithography and masking techniques and dry etch processes. After completing the dual-thickness oxide structure 16 and the trapping dielectric spacers 18, source/drain regions will be formed in the substrate 10 by implanting ion dopants into the substrate 10 with the trapping dielectric spacers 18 as the implantation mask. The second oxide layer 36 remaining on the top of the gate electrode 14 may be retained or removed, which is not limited in the present invention.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A method of forming a SONOS gate structure, comprising:
    forming a gate pattern with sidewalls on a substrate, wherein said gate pattern comprises a gate dielectric layer patterned on said substrate and a gate electrode patterned on said gate dielectric layer;
    forming a first oxide layer on said gate pattern and said substrate;
    forming a first dielectric layer on said first oxide layer, wherein said first dielectric layer is formed of silicon nitride;
    etching back said first dielectric layer to expose said first oxide layer, leaving first dielectric spacers on said first oxide layer adjacent to said sidewalls of said gate pattern respectively;
    etching back said first oxide layer and said first dielectric spacers to expose said substrate and the top of said gate electrode, leaving oxide spacers along said sidewalls of said gate pattern respectively, and leaving said first dielectric spacers on said oxide spacers respectively, wherein the oxide spacers have a thickness of 70~200 Angstroms;
    forming a second oxide layer on the exposed portions of said substrate, said gate electrode and said oxide spacers, wherein the thickness of the oxide spacers is thicker than that of the second oxide layer and the second oxide layer is selectively formed on the oxide spacers;
    forming a second dielectric layer on said first dielectric spacers and said second oxide layer; and
    etching back said second dielectric layer to expose said second oxide layer, leaving second dielectric spacers adjacent to said sidewalls of said gate pattern respectively.

2. The method of forming a SONOS gate structure of claim 1, wherein said second oxide layer on said substrate is a relatively thinner oxide portion, and said oxide spacer along said sidewall of said gate pattern is a relatively thicker oxide portion.

3. The method of forming a SONOS gate structure of claim 2, wherein said relatively thinner oxide portion has a thickness of 20~60 Angstroms.

4. The method of forming a SONOS gate structure of claim 1, wherein said first oxide layer and said second oxide layer are formed of silicon oxide.

5. The method of forming a SONOS gate structure of claim 1, wherein a combination of said first dielectric spacer and said second dielectric spacer along one of said sidewalls of said gate pattern serves as a trapping dielectric spacer.

6. The method of forming a SONOS gate structure of claim 5, wherein said second dielectric layer is formed of silicon nitride.

7. The method of forming a SONOS gate structure of claim 5, further comprising implanting ions into said substrate to form source/drain regions using said trapping dielectric spacers as an implantation mask.

8. The method of forming a SONOS gate structure of claim 1, wherein said second oxide layer is selectively grown on the exposed portions of said substrate, said gate electrode and said oxide spacers through a thermal oxidation process.

* * * * *